United States Patent
Chen

(10) Patent No.: US 6,440,840 B1
(45) Date of Patent: Aug. 27, 2002

(54) DAMASCENE PROCESS TO ELIMINATE COPPER DEFECTS DURING CHEMICAL-MECHANICAL POLISHING (CMP) FOR MAKING ELECTRICAL INTERCONNECTIONS ON INTEGRATED CIRCUITS

(75) Inventor: Ying-Ho Chen, Taipei (TW)

(73) Assignee: Taiwan Semiconductor Manufactoring Company, Hsin-Chu (TW)

( * ) Notice: Subject to any disclaimer, the term of this patent is extended or adjusted under 35 U.S.C. 154(b) by 0 days.

(21) Appl. No.: 10/056,976

(22) Filed: Jan. 25, 2002

(51) Int. Cl.[7] .......................................... H01L 21/4763
(52) U.S. Cl. .................... 438/624; 438/631; 438/626; 438/645; 438/675; 438/687
(58) Field of Search ............................... 438/687, 675, 438/645, 758, 624, 626, 622, 631

(56) References Cited

U.S. PATENT DOCUMENTS

| | | | |
|---|---|---|---|
| 5,880,018 A | 3/1999 | Boeck et al. | 438/619 |
| 6,071,809 A | 6/2000 | Zhao | 438/634 |
| 6,100,184 A | 8/2000 | Zhao et al. | 438/638 |
| 6,130,102 A | 10/2000 | White, Jr. et al. | 438/3 |
| 6,140,226 A | 10/2000 | Grill et al. | 438/637 |
| 6,294,487 B1 * | 9/2001 | Keshavaraj | 280/728.1 |
| 6,331,479 B1 * | 12/2001 | Li et al. | 438/618 |

* cited by examiner

Primary Examiner—Olik Chaudhuri
Assistant Examiner—Timothy Sutton
(74) Attorney, Agent, or Firm—George O. Saile; Stephen B. Ackerman

(57) ABSTRACT

A novel copper damascene method for making metal interconnections on semiconductor integrated circuits was achieved. This method avoids overpolishing into a low-k dielectric fluorine-doped glass which would cause copper-flake defects resulting in intralevel electrical shorts. The method utilizes a stacked hard-mask layer on the doped glass layer consisting of a first polish-stop layer, a sacrificial insulating layer and an upper second polish-stop layer. After etching trenches in the stacked hard-mask layer and the doped glass, a copper layer is deposited to fill the trenches and is polished back to the second polish-stop layer. The high polish-back selectivity of the copper to the second polish-stop layer results in improved polish-back uniformity across the substrate. The relatively thin second polish-stop layer can then be polished back and partially into the sacrificial layer without overpolishing and damaging the underlying first polish-stop layer. The sacrificial layer is then removed to complete a level of metal interconnections. The method can be repeated to complete the multilevel of interconnections.

20 Claims, 2 Drawing Sheets

DAMASCENE PROCESS TO ELIMINATE COPPER DEFECTS DURING CHEMICAL-MECHANICAL POLISHING (CMP) FOR MAKING ELECTRICAL INTERCONNECTIONS ON INTEGRATED CIRCUITS

BACKGROUND OF THE INVENTION (1) Field Of The Invention

The present invention relates to a method of making advanced multilevel interconnections on integrated circuits, and more particularly relates to a method for an improved copper damascene process that uses a low-k dielectric insulator which eliminates copper defects (Cu flakes) during chemical-mechanical polishing (CMP). The method uses an improved hard-mask scheme with an interposed sacrificial layer between two polishing stop layers. The sacrificial layer protects the bottom stop layer from overpolishing during polish-back, which eliminates the Cu flake problem that can cause electrical intralevel shorts.

(2) Description Of The Prior Art

Advanced semiconductor processing technologies, such as high-resolution photolithography and anisotropic plasma etching, are dramatically reducing the feature sizes of semiconductor devices. This has resulted in increased device packing density on semiconductor substrates leading to Ultra Large Scale Integration (ULSI). For example, device feature sizes are now well below one-half micrometer, and the number of discrete devices utilized in making integrated circuits has increased to well over a million on many integrated circuits, such as the microprocessor, dynamic random access memory (DRAM), and the like.

It is common practice in the semiconductor industry to interconnect these discrete semiconductor devices by using multilevels of patterned metal layers to complete the integrated circuits. Interposed insulating layers having via holes between the metal layers and contact openings to the semiconducting substrate are used to electrically insulate the various metal levels.

To achieve this high density of wiring for electrical interconnections without increasing the RC time constant (resistance×capacitance), it is necessary to use metallurgies that have lower resistivity, such as copper, and to use insulating layers, such as fluorine-doped silicon glass (FSG), that has a lower dielectric constant.

Another processing problem is the accumulated effect of depositing and patterning the metal layers, one layer over another, that results in an irregular or substantially non-planar surface on an otherwise microscopically planar substrate. The rough topography becomes substantially worse as the number of metal levels increases. The downscaling of devices and the formation of the interconnecting metal wiring over the rough topography result in several processing problems. For example, improvements in photolithographic resolution requires a shallow depth of focus (DOF) during photoresist exposure, and results in unwanted distortion of the photoresist images when the photoresist is exposed over the rough topography. Another problem occurs during anisotropic etching to pattern a metal layer. It is difficult to remove the metal over steps in the rough topography because of the directional nature of the anisotropic etch. This rough topography and anisotropic etching can lead to intralevel shorts between metal lines.

One approach to circumventing these topographic problems is to use a planar technology and a damascene technique, in which trenches (also referred to as recesses) having vertical sidewalls are anisotropically plasma etched in a planar insulating layer. A metal layer, such as Cu, is deposited on the insulating layer, thereby filling the trenches in the insulating layer. The metal layer is chemically-mechanically polished (CMP) back to the insulating layer surface to form metal lines that are imbedded in, and coplanar with the insulating layer surface. In a dual damascene process contact openings and via holes are etched at the same time as the trenches, and then both the trenches and the via holes are simultaneously filled with a metal, such as Cu, and polished back at the same time to further reduce the number of processing steps.

Unfortunately, when one polishes back the copper to the low-dielectric layer, copper flakes (defects) are formed on the surface causing intralevel shorts and increasing the in-line queue time (Q-time) due to additional inspection time and wafer rework time. One method of avoiding the Cu over-polish during the damascene process is described in U.S. Pat. No. 6,071,809 to Zhao. In Zhao's process a two-layer stack of silicon oxide and silicon nitride is used during the CMP. The silicon oxide is used as a sacrificial layer during the metal CMP to protect the silicon nitride hard mask and to prevent delamination of the underlying low-k dielectric. In U.S. Pat. No. 5,880,018 to Boech et al. a silicon dioxide layer is used in which trenches are etched and filled with a metal. The silicon dioxide is then removed and replaced with a low-k dielectric. U.S. Pat. No. 6,130,102 to White et al. is a method for making a dual inlaid electrical structure for making electrical contact to the substrate for DRAMs. After forming a planar insulating layer on the substrate, contact openings are etched in the insulating layer for the DRAM capacitor node and bit line contacts. A metal, such as iridium or ruthenium, is deposited and CMP back to form contacts. The Cu CMP issue is not addressed. U.S. Pat. No. 6,140,226 to Grill et al. is a method for making an improved dual relief pattern in a stacked hard-mask layer for a dual damascene process. The method does not address the Cu polish-back issue. In U.S. Pat. No. 6,100,184 to Zhao, a dual-damascene process is described for making electrical interconnections in a low-k dielectric insulator using a single hard-mask layer composed of silicon oxide or a metal. The method does not address the Cu CMP overpolish problem cited above.

There is still a strong need in the semiconductor industry to further improve upon the damascene or dual-damascene process to include a hard mask that eliminates the Cu flake problem while improving the polish-back uniformity across the wafer (substrate).

SUMMARY OF THE INVENTION

It is therefore a principal object of the present invention to provide an improved damascene scheme to eliminate copper-flake defects after polishing back a copper layer to form the copper metal interconnections.

Another object of this invention is to achieve this improved damascene scheme by including a second polish-stop layer (a second hard-mask layer) and a sacrificial layer over a first polish-stop layer (first hard-mask layer). The second polish-stop layer improves the planarization across the wafer during the Cu polish back while the sacrificial layer protects the underlying first hard-mask layer from damage, thereby preventing copper exposure to the fluorine in a fluorine-doped low-k dielectric layer during CMP.

The method is now briefly described for fabricating electrical interconnections on a partially completed substrate having a patterned conducting layer. This novel damascene process is an improvement over the prior art. The method utilizes an additional'second polish-stop layer to improve the Cu polish-back uniformity while a sacrificial layer between the first and second polish-stop layers prevents polish damage to the first polish-stop layer and eliminates fluorine contamination of the Cu layer that would otherwise result in copper flaking that causes electrical shorts.

The method begins by depositing a protective barrier layer on the conducting layer. A low-dielectric insulating layer, preferably fluorine-doped silicon glass, is deposited on the barrier layer to provide insulation for the highly conducting interconnecting lines. By the method of this invention, a stacked hard-mask layer is formed by depositing a first polish-stop layer, a sacrificial layer, and a second polish-stop layer on the low-dielectric insulating layer. Trenches are etched in the stacked hard-mask layer and in the low-dielectric insulating layer to provide for the electrical interconnections. Also on portions of the substrate the trenches are etched through the underlying barrier layer and into the conducting layer to provide electrical contacts between electrical interconnecting levels. Next, another barrier layer is deposited to conformally coat the trenches. A copper layer is deposited on the stacked layer sufficiently thick to fill the trenches. The copper layer is selectively polished back to the second (upper) polish-stop layer to result in a relatively uniform polish-back of the Cu layer, and the polishing is continued to partially polish into the sacrificial layer. The interposed sacrificial layer protects the first (lower) polish-stop layer from CMP damage and prevents the fluorine (F) from reacting with the copper layer that would otherwise cause Cu flakes resulting in electrical shorts. The relatively thin sacrificial layer is then removed to the first polish-stop layer using a highly selective CMP or selective plasma etch. This completes a level of the electrical interconnections. The process can be repeated for each interconnect level to complete the multilevels of wiring. The method is also applicable to a dual damascene scheme.

BRIEF DESCRIPTION OF THE DRAWINGS

The objects and other advantages of the invention are best understood with reference to the preferred embodiment when read in conjunction with the following drawings.

DESCRIPTION OF THE PREFERRED EMBODIMENT

The present invention relates to an improved damascene process or dual-damascene process that uses a stacked hard-mask layer to eliminate Cu flakes that can cause intralevel shorts. The stacked hard-mask layer. consists of silicon nitride/undoped silicon glass/silicon oxynitride (SiN/USG/SiON) or silicon carbide (SiC)/USG/SiON on a low-dielectric fluorine-doped silicon glass (FSG) layer. Although the method is shown for a single damascene process, it should be understood by those skilled in the art that the method is also applicable to a dual damascene process.

Figure 1:
FIGS. 1 through 5 show schematic cross-sectional views for the sequence of process steps for forming a single level of planar electrical interconnections on a substrate by the method of this invention.

Referring to FIG. 1, the novel Cu damascene scheme of this invention begins by providing a partially completed substrate up to and including an electrical conducting layer 10. The electrical conducting layer is typically a polycide layer or one of the metal layers, such as Cu, commonly used in the industry. The conducting layer 10 is typically planar and is patterned to form a level of electrical interconnections for wiring the discrete semiconductor devices in and on the substrate. Next a barrier layer 12 is deposited to protect the underlying conducting layer 10 from contamination, such as caused by F and other mobile ions (Na and the like). The barrier layer 12 is preferably silicon nitride ($Si_3N_4$), deposited by a low-temperature deposition such as plasma-enhanced chemical vapor deposition (PECVD) using a reactant gas mixture such as $SiH_4$ and $NH_3$. The barrier layer 12 is deposited to a thickness of between about 200 and 1000 Angstroms. To achieve low RC constants a low-dielectric insulating layer 14 is deposited. Layer 14 is preferably a fluorine-doped silicon glass (FSG), and is deposited by plasma-enhanced chemical-vapor deposition (PECVD) using fluorine-doped tetraethosiloxane (F-TEOS) on the barrier layer 12. The insulating layer 14 is deposited to a preferred thickness of between about 2000 and 6000 Angstroms.

Still referring to FIG. 1 and more specifically to the method of this invention, a stacked hard-mask layer is formed on the insulating layer 14. The stacked layer is formed by depositing a first polish-stop layer 16, a sacrificial layer 18, and a second polish-stop layer 20. The first polish-stop layer 16 is preferably $Si_3N_4$, deposited by PECVD to a thickness of between about 500 and 1000 Angstroms. Alternatively the first polish-stop layer 16 can be silicon carbide (SiC), deposited by PECVD to a thickness of between about 500 and 1000 Angstroms. Next a sacrificial layer 18, which serves as a buffer layer for chem-mech polishing, is deposited. Layer 18 is preferably an undoped $SiO_x$. and is deposited by PECVD using a reactant gas such as tetraethosiloxane (TEOS). The sacrificial layer 18 is deposited to a thickness of between about 500 and 1000 Angstroms. The second polish-stop layer 20 is preferably a SiON and is deposited by PECVD using a reactant gas mixture of $SiH_4$, $N_2O$, and $NH_3$ to a thickness of between about 500 and 1500 Angstroms.

Figure 2:
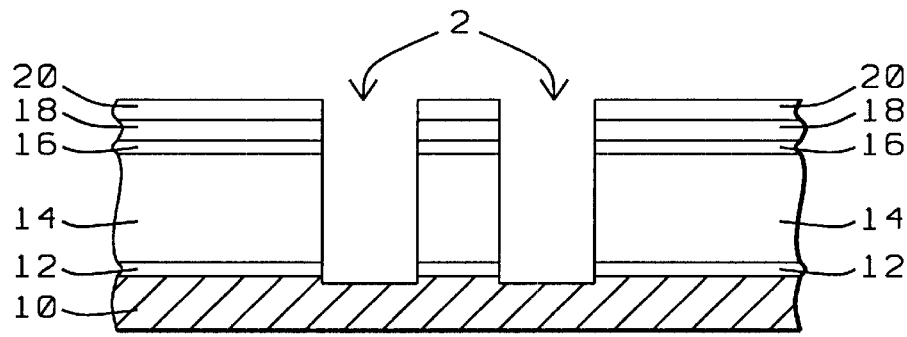

Referring to FIG. 2, trenches 2 are etched in the stacked hard-mask layer (20, 18, 16) and partially into the low-dielectric insulating layer 14 to provide for the electrical interconnections. On portions of the substrate the trenches are also etched down through the barrier layer 12 to form contact openings 2 to the underlying conducting layer 10, as shown in the cross section in FIG. 2. The trenches 2 are etched using conventional photolithographic techniques and anisotropic plasma etching. The photoresist mask is not depicted in FIG. 2. The trenches 2 in the stacked layer (20, 18, 16) are preferably etched using high-density plasma (HDP) etching and an etchant gas mixture containing fluorine. The trenches 2 are etched in the FSG insulating layer 14 using HDP etching and an etchant gas mixture that also contains fluorine.

Figure 3:
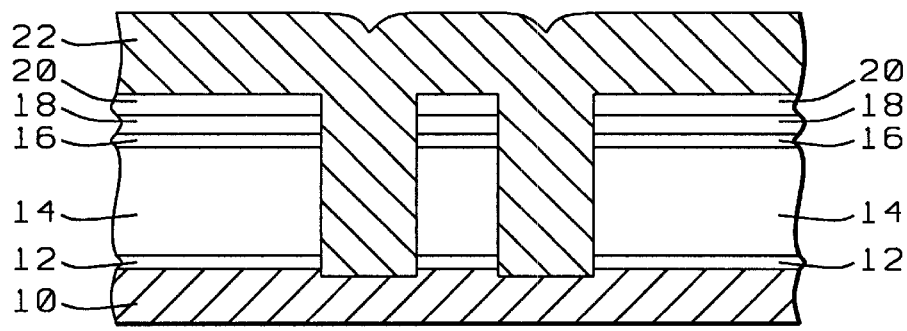

Referring to FIG. 3, a copper layer 22 is deposited on the stacked hard-mask layer and is sufficiently thick to fill the widest trenches 2, and more specifically to a thickness of between about 5000 and 15000 Angstroms. The Cu layer 22 is preferably deposited by first forming a barrier layer (not shown), such as tantalum (Ta) or tantalum nitride (TaN), which is deposited by physical vapor deposition. Then a Cu seed layer (not shown) is deposited to provide electrical continuity across the wafer for the copper electroplating. The seed layer is formed preferably by physical vapor deposition, such as by sputtering from a Cu target. The barrier layer is formed to a thickness of between about 100 and 400 Angstroms, and the Cu seed layer is formed to a thickness of between about 800 and 2000 Angstroms. The Cu layer 22 is then formed by electroplating using a plating solution. For example, a commercially available plating tool such as manufactured by The Semitool Company of U.S.A can be used with a plating solution of $CuSO_4$.

Figure 4:
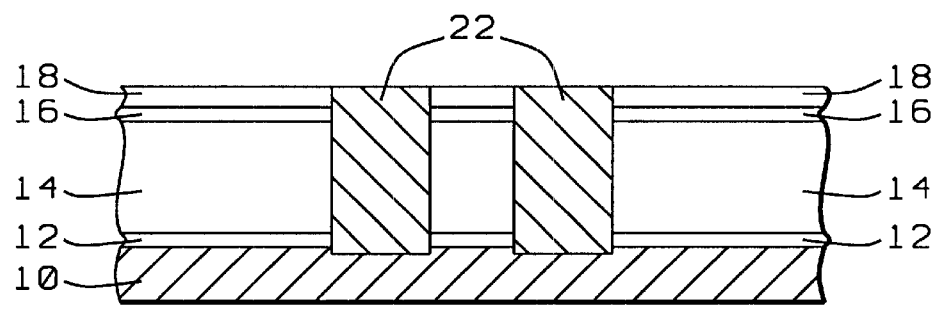

Referring to FIG. 4 and a key feature of the invention, the copper layer 22 is selectively polished back to the second (upper) polish-stop layer 20. The polishing is carried out using a comercially available polishing tool such as a model 472, manufactured by IPEC of U.S.A and a polishing slurry consisting, for example, of an abrasive such as $Al_2O_3$ or silica. The polish-back selectivity of copper to the SiON second polish-stop layer 20 is preferably greater than 70:1 to significantly improve the polish-back uniformity of the Cu layer across the substrate without significantly overpolishing the underlying upper polish-stop layer 20. The substrate is polished further to remove the SiON layer 20 and is polished partially into the sacrificial layer 18. The interposed sacrificial layer 18 provides a buffer layer that protects the first (lower) polish-stop layer 16 from CMP damage and prevents the fluorine (F) from reacting with the Cu layer 22 that would otherwise cause Cu flakes resulting in electrical shorts.

Figure 5:
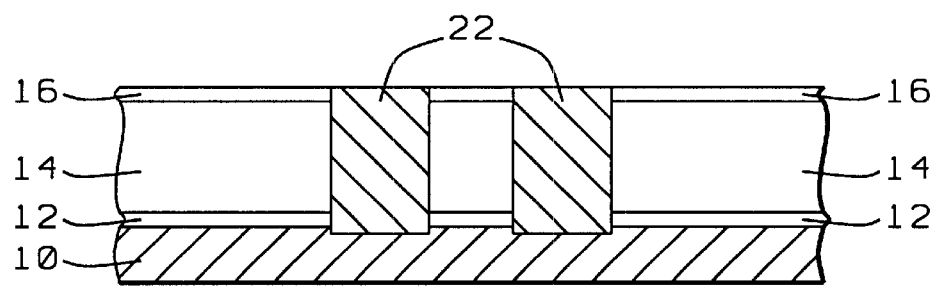

Referring to FIG. 5, to complete one level of electrical interconnections, the remaining portion of the relatively thin sacrificial layer 18 is then removed to the first polish-stop layer 16 using a highly selective CMP or selective plasma etch. For example, layer 18 can be chem-mech polished back by using a rotary or linear CMP tool and a polishing slurry, for example, a slurry consisting of an abrasive such as $Al_2O_3$ or silica and by adjusting the polishing pressure to achieve a polishing selectivity of at least 5:1 of the USG sacrificial layer 18 to the $Si_3N_4$ first polish-stop layer 16. Alternatively, the USG sacrificial layer 18 can be removed by high-density plasma etching using an etchant gas containing $CF_4$.

While the invention has been particularly shown and described with reference to the preferred embodiment thereof, it will be understood by those skilled in the art that various changes in form and details may be made without departing from the spirit and scope of the invention. Although the above method is described for an improved damascene process for forming a single level of electrical interconnections, the method can be repeated to form multilevels of electrical interconnections.

What is claimed is:

1. A method for fabricating electrical interconnections using a damascene process on a substrate having a conducting layer comprising the steps of:
    depositing a barrier layer on said conducting layer;
    depositing a low-dielectric insulating layer on said barrier layer;
    forming a stacked layer by depositing a first polish-stop layer, a sacrificial layer, and a second polish-stop layer on said insulating layer;
    etching trenches in said stacked layer, said insulating layer, and said barrier layer extending to said conducting layer on portions of said substrate;
    forming a copper layer on said stacked layer and filling said trenches;
    selectively polishing back said copper layer to said second polish-stop layer and partially polishing into said sacrificial layer;
    selectively removing remaining portions of said sacrificial layer to said first polish-stop layer to complete a level of said electrical interconnections.

2. The method of claim 1, wherein said conducting layer is selected from the group that includes polysilicon, metal silicide, aluminum, and copper.

3. The method of claim 1, wherein said barrier layer is silicon nitride.

4. The method of claim 1, wherein said low-dielectric insulating layer is a fluorine-doped silicon glass.

5. The method of claim 1, wherein said first polish-stop layer is composed of silicon nitride.

6. The method of claim 1, wherein said first polish-stop layer is composed of silicon carbide.

7. The method of claim 1, wherein said sacrificial layer is an undoped silicon glass.

8. The method of claim 1, wherein said second polish-stop layer is silicon oxynitride.

9. The method of claim 1, wherein said copper layer is formed from a seed layer and electroplating.

10. A method for fabricating electrical interconnections using a damascene process on a substrate having a conducting layer comprising the steps of:
    depositing a barrier layer on said conducting layer;
    depositing a low-dielectric insulating layer composed of a fluorine-doped silicon glass on said barrier layer;
    forming a stacked layer by depositing a first polish-stop layer, a sacrificial layer, and a second polish-stop layer on said insulating layer;
    etching trenches in said stacked layer, said insulating layer, and said barrier layer extending to said conducting layer on portions of said substrate;
    forming a copper layer on said stacked layer and filling said trenches;
    selectively polishing back said copper layer to said second polish-stop layer and partially polishing into said sacrificial layer;
    selectively removing remaining portions of said sacrificial layer to said first polish-stop layer to complete a level of said electrical interconnections.

11. The method of claim 10, wherein said conducting layer is selected from the group that includes polysilicon, metal silicide, aluminum, and copper.

12. The method of claim 10, wherein said barrier layer is silicon nitride and is deposited to a thickness of between about 500 and 1000 Angstroms.

13. The method of claim 10, wherein said low-dielectric insulating layer is deposited to a thickness of between about 2000 and 6000 Angstroms.

14. The method of claim 10, wherein said first polish-stop layer is composed of silicon nitride deposited by plasma enhanced chemical vapor deposition to a thickness of between about 500 and 1000 Angstroms.

15. The method of claim 10, wherein said first polish-stop layer is composed of silicon carbide deposited by plasma-enhanced chemical-vapor deposition to a thickness of between about 500 and 1000 Angstroms.

16. The method of claim 10, wherein said sacrificial layer is an undoped silicon glass and is deposited to a thickness of between about 500 and 1000 Angstroms.

17. The method of claim 10, wherein said second polish-stop layer is silicon oxynitride and is deposited to a thickness of between about 500 and 1500 Angstroms.

18. The method of claim 10, wherein said copper layer has a thickness of between about 5000 and 15000 Angstroms.

19. The method of claim 10, wherein said copper layer is formed from a seed layer and electroplating.

20. The method of claim 10, wherein said remaining portions of said sacrificial layer are selectively removed to said first polish-stop layer by selectively polishing back with a selectivity greater than 3.

* * * * *